(12) United States Patent
Kuchimachi

(10) Patent No.: US 10,418,265 B2
(45) Date of Patent: Sep. 17, 2019

(54) SAMPLE HOLDER AND PLASMA ETCHING APPARATUS USING SAME

(71) Applicant: KYOCERA Corporation, Kyoto-shi, Kyoto (JP)

(72) Inventor: Kazuhiro Kuchimachi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 927 days.

(21) Appl. No.: 14/764,228

(22) PCT Filed: Jan. 30, 2014

(86) PCT No.: PCT/JP2014/052032
§ 371 (c)(1),
(2) Date: Jul. 29, 2015

(87) PCT Pub. No.: WO2014/119637
PCT Pub. Date: Aug. 7, 2014

(65) Prior Publication Data
US 2015/0364355 A1 Dec. 17, 2015

(30) Foreign Application Priority Data
Jan. 30, 2013 (JP) ................. 2013-016088

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
None
See application file for complete search history.

(56) References Cited

U.S. PATENT DOCUMENTS

| 7,361,865 B2* | 4/2008 | Maki ................ H01L 21/67103 219/444.1 |
| 2003/0015516 A1 | 1/2003 | Natsuhara et al. |
| 2004/0182321 A1* | 9/2004 | Kuibira ............ H01L 21/67103 118/728 |
| 2005/0166848 A1* | 8/2005 | Natsuhara ......... H01L 21/67103 118/728 |

(Continued)

FOREIGN PATENT DOCUMENTS

| JP | 2002-313890 A | 10/2002 |
| JP | 2004-111289 A | 4/2004 |
| JP | 2005-286106 A | 10/2005 |

(Continued)

OTHER PUBLICATIONS

Machine Generated English Translation of JP2002-313890A. Held to Natsuhara et al. Published Oct. 25, 2002.*

(Continued)

*Primary Examiner* — Sylvia MacArthur
(74) *Attorney, Agent, or Firm* — Volpe and Koenig, P.C.

(57) ABSTRACT

A sample holder includes a substrate composed of ceramics, having a sample holding surface on one main surface thereof; and a heat-generating resistor provided on an other main surface of the substrate, containing a glass component. The substrate contains the glass component in a vicinity region of the heat-generating resistor.

9 Claims, 3 Drawing Sheets

(56) References Cited

U.S. PATENT DOCUMENTS

2012/0164314 A1* 6/2012 LaBranche ............. C03C 3/062
                                                    427/101
2018/0019148 A1* 1/2018 Cox .................... H01L 21/6831

FOREIGN PATENT DOCUMENTS

| JP | 2006-073903 A | 3/2006 |
| JP | 2007-165901 A | 6/2007 |
| TW | 201227761 A1 | 7/2012 |

OTHER PUBLICATIONS

Taiwanese Decision of Refusal with English concise explanation, Taiwan Patent Application No. 103103713, dated Jan. 19, 2016, 5 pgs.
International Search Report, PCT/JP2014/052032, dated Mar. 4, 2014, 1 pg.
Japanese Office Action with English concise explanation, Japanese Patent Application No. 2014-559727, dated Jul. 12, 2016, 5 pgs.
Chinese Office Action with English concise explanation, Chinese Patent Application No. 201480006547.0, dated Oct. 9, 2016, 7 pgs.

\* cited by examiner

SAMPLE HOLDER AND PLASMA ETCHING APPARATUS USING SAME

TECHNICAL FIELD

The present invention relates to a sample holder and a plasma etching apparatus using the same.

BACKGROUND ART

In a fabrication process for semiconductor integrated circuits, a fabrication process for liquid crystal display devices, or the like, a sample holder is known as a component part for holding each sample such as a semiconductor wafer. For example, such sample holders include a heater substrate described in Japanese Unexamined Patent Publication JP-A 2005-286106 (referred to as Patent Literature 1, hereinafter). The heater substrate described in Patent Literature 1 includes: a ceramic substrate; and a heat-generating element circuit formed in a rear face of the ceramic substrate. The heater substrate is used in a state where a to-be-heated object is mounted on a main surface of the ceramic substrate.

Nevertheless, in the heater substrate described in Patent Literature 1, in some cases, a thermal stress has occurred between the ceramic substrate and the heat-generating element circuit under heat cycles. This has caused a possibility that the heat-generating element circuit is separated from the ceramic substrate. Thus, long-term reliability of the heater substrate has been difficult to be improved.

SUMMARY OF INVENTION

A sample holder according to one aspect of the invention comprises: a substrate composed of ceramics, comprising a sample holding surface provided in one main surface thereof; and a heat-generating resistor provided on an other main surface of the substrate, containing a glass component, the substrate containing the glass component in a vicinity region of the heat-generating resistor.

DESCRIPTION OF EMBODIMENTS

A sample holder 10 according to an embodiment of the invention and a plasma etching apparatus 100 using the same are described below with reference to the drawings.

Figure 1:
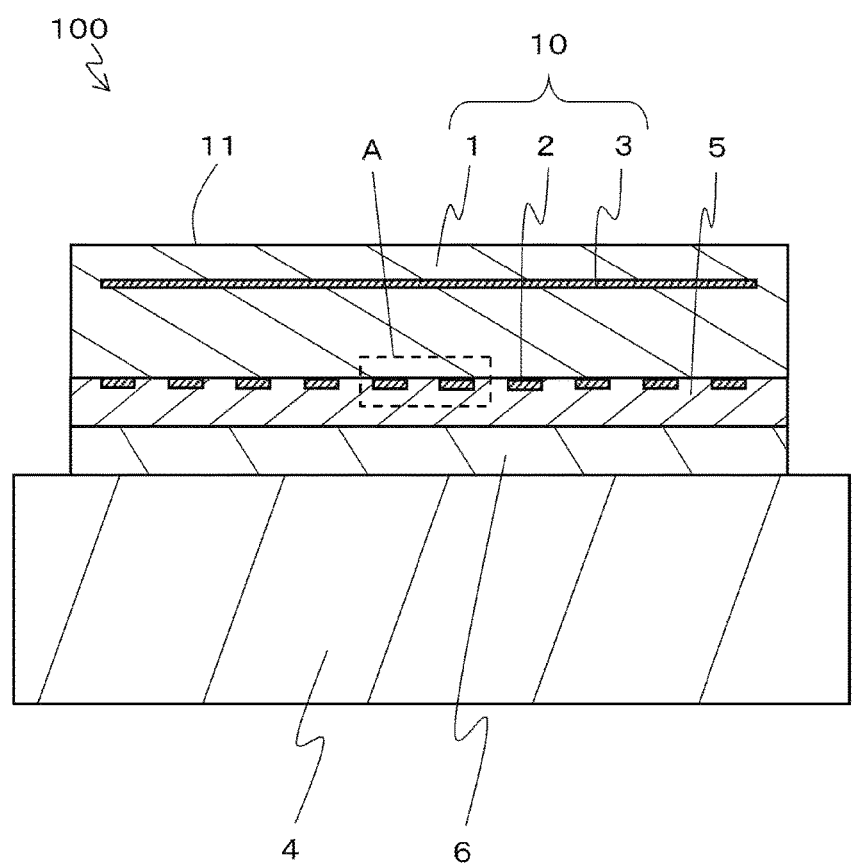
FIG. 1 is a sectional view showing a sample holder according to an embodiment of the invention and a plasma etching apparatus using the same.

FIG. 1 is a sectional view showing a sample holder 10 according to an embodiment of the invention and a plasma etching apparatus 100 using the same. As shown in FIG. 1, the sample holder 10 according to an embodiment of the invention includes: a substrate 1 having a sample holding surface 11 provided in one main surface thereof; a heat-generating resistor 2 provided on the other main surface of the substrate 1; and an adsorption electrode 3 provided in the inside of the substrate 1. In the present embodiment, the "one main surface" corresponds to an upper face of the substrate 1 and "the other main surface" corresponds to a lower face of the substrate 1. Thus, in the following description, for convenience of description, the terms "upper face" and "lower face" are employed. Here, the "one main surface" is not limited to the upper face. That is, in accordance with the orientation of the substrate 1, a surface other than the upper face like the lower face or the side face may be employed without a problem. Further, "the other main surface" is not limited to the lower face. That is, similarly in accordance with the orientation of the substrate 1, a surface other than the lower face like the upper face or the side face may be employed without a problem.

The substrate 1 is a plate-shaped member having a sample holding surface 11 provided in the upper face thereof. In the substrate 1, for example, the sample holding surface 11 provided in the upper face holds a sample such as a silicon wafer. The sample holder 10 is a member having a circular shape in plan view. For example, the substrate 1 is constructed from a ceramic material such as alumina, aluminum nitride, silicon nitride, and yttria. The heat-generating resistor 2 is provided on the lower face of the substrate 1. As for the dimensions of the substrate 1, for example, the diameter may be set to be 200 to 500 mm and the thickness may be set to be 2 to 15 mm.

As the method of holding a sample by using the substrate 1, various methods may be employed. Then, in the sample holder 10 of the present embodiment, a sample is held by an electrostatic force. For this purpose, the sample holder 10 includes the adsorption electrode 3 provided in the inside of the substrate 1. The adsorption electrode 3 is composed of two electrodes. One of the two electrodes is connected to a positive electrode of a power supply and the other electrode is connected to a negative electrode of the power supply. The two electrodes are each formed in a substantially semicircle plate shape and then disposed in the inside of the substrate 1 such that the chords of the semicircles face each other. These two electrodes together form a circular outer shape of the entirety of the adsorption electrode 3. The center of the circular outer shape formed by the entirety of the adsorption electrode 3 is set identical to the center of the outer shape of the substrate 1 similarly having a circular shape. For example, the adsorption electrode 3 is constructed from a metallic material such as tungsten or molybdenum.

The heat-generating resistor 2 is a member for heating a sample held on the sample holding surface 11 in the upper face of the substrate 1. The heat-generating resistor 2 is provided on the lower face of the substrate 1. When a voltage is applied to the heat-generating resistor 2, the heat-generating resistor 2 can generate heat. The heat generated by the heat-generating resistor 2 is transmitted through the inside of the substrate 1 and then reaches the sample holding surface 11 in the upper face of the substrate 1. By virtue of this, the sample held on the sample holding surface 11 can be heated. The heat-generating resistor 2 is a linear pattern having a plurality of bends and is formed almost over the entirety of the lower face of the substrate 1. Thus, a situation can be suppressed that variation in the heat distribution occurs in the upper face of the sample holder 10.

The heat-generating resistor 2 contains a conductor component and a glass component. As the conductor component, for example, a metallic material such as silver palladium, platinum, aluminum, or gold is contained. In order to suppress foaming of the glass component, it is preferable that a metal that can be sintered in the atmosphere is selected as the metallic material. Further, as the glass component, the oxide of a material such as silicon, aluminum, bismuth, calcium, boron, and zinc is contained.

In temperature control of the sample holder 10, the following method may be employed. Specifically, when a thermocouple is brought into contact with the substrate 1 and then the electromotive force is measured, the temperature of the heat-generating resistor 2 can be measured. Further, even when a resistance temperature sensor is brought into contact with the substrate 1 and then the resistance is measured, the temperature of the heat-generating resistor 2 can be measured. On the basis of the temperature of the heat-generating resistor 2 measured as described above, the voltage applied to the heat-generating resistor 2 is adjusted so that heat generation of the heat-generating resistor 2 can be controlled such that the temperature of the sample holder 10 may become constant.

As described above, the heat-generating resistor 2 contains a glass component as a raw material. The fact that the heat-generating resistor 2 contains the glass component reduces the temperature necessary for sintering. Further, the fact that the heat-generating resistor 2 has the glass component improves adhesion with the substrate 1.

Here, the heat-generating resistor 2 is formed by firing onto the substrate 1 after sintering. At that time, the glass component contained in the heat-generating resistor 2 spreads and enters into the depressions and protrusions in the surface of the substrate 1. As a result, an anchor effect occurs between the heat-generating resistor 2 and the substrate 1 so that the heat-generating resistor 2 can firmly be fixed to the substrate 1. Further, the glass component having spread on the surface of the substrate 1 reacts with the ceramics of the substrate 1 so as to diffuse into the substrate 1. Thus, as shown in the partly enlarged sectional view of FIG. 2 where a region A of the sample holder shown in FIG. 1 is enlarged, the vicinity region of the heat-generating resistor 2 of the substrate 1 contains the glass component. In the following description, the region containing the glass component in the vicinity of the heat-generating resistor 2 of the substrate 1 is referred to as a glass diffusion region 12. As such, since the vicinity region of the heat-generating resistor 2 (the glass diffusion region 12) of the substrate 1 and the heat-generating resistor 2 contain the glass component individually, adhesion is improved between the glass component of the heat-generating resistor 2 and the glass component of the glass diffusion region 12. As a result, even when a thermal expansion difference between the substrate 1 and the heat-generating resistor 2 causes a thermal stress in the heat-generating resistor 2, a possibility can be suppressed that the heat-generating resistor 2 is separated from the substrate 1. For example, the glass component is contained in 5 to 30 vol % in the heat-generating resistor 2.

In a case where the substrate 1 is constructed from a high insulating material having a volume resistivity of $10^{16}$ Ωcm or higher in an ordinary temperature, the volume resistivity of the glass diffusion region 12 in the vicinity of the heat-generating resistor 2 can be made lower than that of the region not containing the glass. Employable high insulating materials of $10^{16}$ Ωcm or higher include a high insulation ceramic material such as alumina, aluminum nitride, silicon nitride, and yttria.

Adsorption of a wafer serving as a sample is achieved by applying a high voltage to the adsorption electrode 3. Then, removal of the wafer is achieved by connecting (grounding) the adsorption electrode 3 to the ground. At that time of ON-OFF of the voltage, electric field fluctuation occurs. Here, since the glass component is provided around the heat-generating resistor 2, the resistance in the vicinity of the heat-generating resistor 2 is reduced. As a result, at the time of occurrence of the electric field fluctuation, the electric field is difficult to act in the vicinity of the heat-generating resistor 2. That is, an electric field shielding effect occurs. This can suppress a situation that a noise occurs on the voltage of the heat-generating resistor 2. As a result, temperature control of the heat-generating resistor 2 can be stabilized.

Further, since the glass component in the vicinity region of the heat-generating resistor 2 of the lower face of the substrate 1 results from diffusion of glass component from the heat-generating resistor 2 into the glass diffusion region 12 in the substrate 1, the glass component of the substrate 1 and the glass component of the heat-generating resistor 2 can be made continuous. As a result, a possibility can further be suppressed that separation occurs between the substrate 1 and the heat-generating resistor 2.

Figure 2:
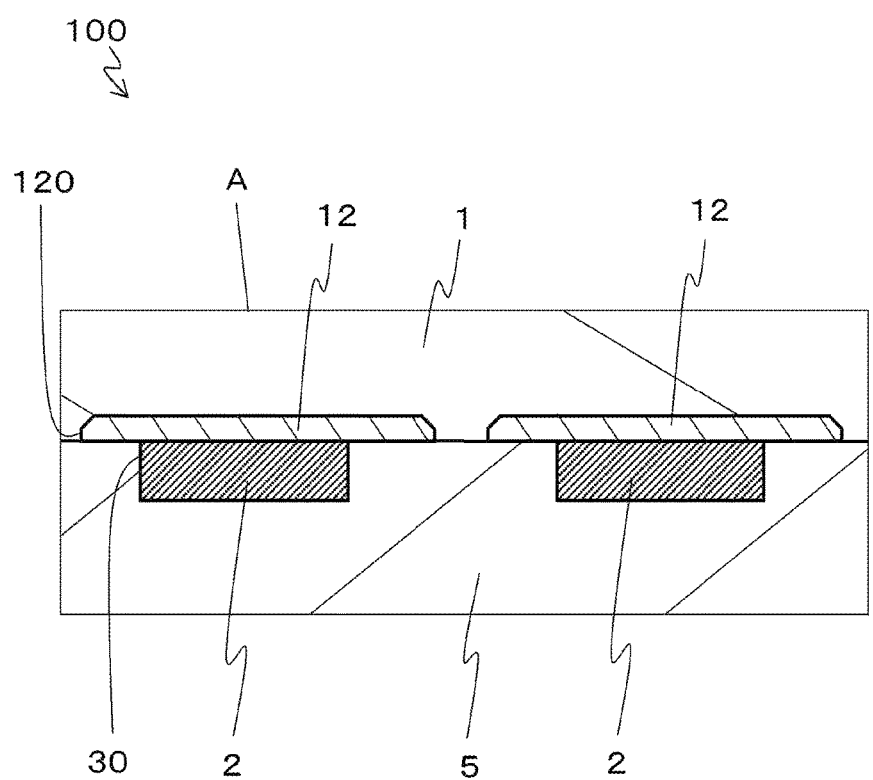
FIG. 2 is a partly enlarged sectional view where a region A of the sample holder shown in FIG. 1 is enlarged.

Further, it is preferable that as shown in FIG. 2, the glass component contained in the glass diffusion region 12 spreads in a horizontal direction along the lower face of the substrate 1 when viewed from a portion contacting the heat-generating resistor 2 provided on the lower face of the substrate 1. By virtue of this, the horizontal-directional position of a boundary 120 between a portion containing the glass component and a portion not containing the glass component of the substrate 1 can be made different from the horizontal-directional position of an end part 30 of the heat-generating resistor 2. Under heat cycles, there is a tendency that a thermal stress is concentrated in the boundary 120 and the end part 30 described above. Then, when these positions are made different from each other, a situation can be avoided that a large thermal stress acts on one place. This can suppress a possibility that separation occurs in the heat-generating resistor 2.

Further, it is preferable that the glass component of the substrate 1 spreads more in the horizontal direction than in a direction perpendicular to the lower face of the substrate 1. That is, it is preferable that the glass diffusion region 12 spreads more largely in the horizontal direction than in a direction perpendicular to the lower face of the substrate 1 when viewed from the end part of the portion contacting the heat-generating resistor 2 provided on the lower face of the substrate 1. In the glass diffusion region 12, since the glass spreads such as to fill gaps in the ceramics in the substrate 1, satisfactory heat conduction is achieved in comparison with the region other than the glass diffusion region 12 in the substrate 1. When the region having satisfactory heat conduction is formed largely in the horizontal direction, horizontal heat uniformity in the substrate 1 can be improved. More specifically, it is preferable that the glass diffusion region 12 spreads more largely in the horizontal direction than in the perpendicular direction by a factor of approximately 2 to 5.

In this case, it is preferable that a ceramic material having a small grain diameter is employed in the substrate 1. Specifically, it is preferable that a ceramic material having a grain diameter of 2 to 10 μm is employed and the sintered density is as dense as 98% or higher. This can suppress a situation that the glass diffuses in a direction perpendicular to the lower face of the substrate 1. As for the horizontal direction along the lower face of the substrate 1, it is preferable that the lower face of the substrate 1 is formed into a roughened surface by sandblast or the like so that fine cracks are generated. When the glass component creeps along these cracks, the glass component can satisfactorily diffuse in the horizontal direction along the lower face of the substrate 1. More specifically, when the lower face of the substrate 1 is machined with a rotary machining apparatus or the like, an arithmetic mean roughness Ra of the lower face becomes 0.2 to 0.7 µm. Further, when sandblast or the like is performed on the lower face of the substrate 1, the arithmetic mean roughness Ra of the lower face can become 1 to 5 µm. By virtue of this, the horizontal spread of the glass diffusion region 12 can become larger than the perpendicular spread by a factor of approximately 2 to 5.

Further, it is preferable that the vicinity region of the heat-generating resistor 2 of the lower face of the substrate 1 contains the glass component as well as the conductor component of the heat-generating resistor 2. The fact that the conductor component is contained can improve the thermal conductivity of the vicinity region of the heat-generating resistor 2. Thus, heat transfer can be improved between the plurality of heat-generating resistors 2. As a result, heat uniformity in the sample holding surface 11 of the substrate 1 can be improved. By virtue of this, the etching rate can be made more uniform in the plasma etching apparatus 100.

Further, it is preferable that the ratio of the conductor component to the glass component decreases with increasing distance from the heat-generating resistor 2. By virtue of this, the thermal expansion coefficient can vary moderately between the vicinity region of the heat-generating resistor 2 in the substrate 1 and the other region. As a result, a thermal stress generated in the substrate 1 in the vicinity region of the heat-generating resistor 2 can be reduced. More specifically, in the vicinity of the heat-generating resistor 2, the conductor component is present in approximately 10% relative to the glass component. Then, it is preferable that the ratio is set to be approximately 7% in a region approximately 0.1 mm distant from the heat-generating resistor 2 and the ratio is set to be approximately 0% in a region approximately 0.2 mm distant.

Further, it is preferable that the heat-generating resistor 2 is provided in the peripheral edge part of the lower face of the substrate 1. When thermal expansion or heat contraction occurs under heat cycles such that the substrate 1 may warp, the thermal stress becomes especially large in the peripheral edge part. In this peripheral edge part, when the heat-generating resistor 2 is provided and the glass component is contained in the vicinity region of the heat-generating resistor 2 in the substrate 1, a possibility can be suppressed that cracks occur in the substrate 1 of the sample holder 10.

Figure 3:
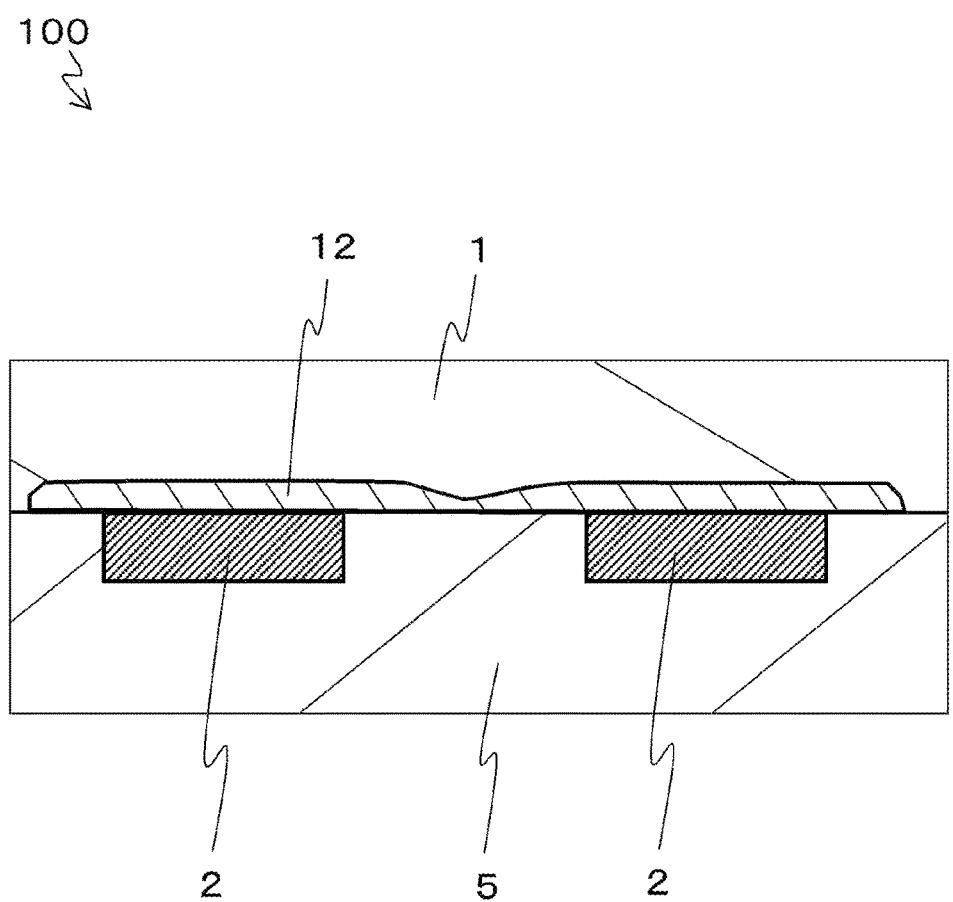
FIG. 3 is a partly enlarged view showing a modified example of a sample holder of the invention.

Further, as shown in FIG. 3, it is preferable that the sample holder has a plurality of regions provided adjacent to the heat-generating resistor 2 and the glass components resulting from diffusion of glass component from the plurality of regions are continuous to each other. That is, it is preferable that there are a plurality of regions provided adjacent to the heat-generating resistor 2 and the glass diffusion region 12 is provided such as to bridge the plurality of regions to each other. When the glass component spreads also into the region between adjacent regions, that is, into the region between adjacent heat-generating resistors 2 between the regions provided adjacent to each other, the plasma density can be made uniform at the time that the sample holder 10 is used in a process in plasma. The reason is described below.

Returning to FIG. 1, a part of the plasma etching apparatus 100 employing the sample holder 10 described above is described below. The plasma etching apparatus 100 includes: a vacuum chamber (not shown); a base plate 4 including a high frequency applying electrode (not shown) disposed in the vacuum chamber; and the sample holder 10 mounted on the base plate 4.

The base plate 4 is a plate-shaped member includes: a passage (not shown) for cooling medium provided in the inside; and a heat transfer gas passage (not shown) for passing a heat transfer gas such as helium and argon provided in the upper face of the sample holder 10. As the base plate 4, for example, a metallic material such as aluminum and titanium, a ceramic material such as silicon carbide, a composite material of silicon carbide and aluminum, or the like may be employed.

The heat-generating resistor 2 of the lower face of the sample holder 10 is covered by an insulating layer 5. As the insulating layer 5, a bonding material containing ceramic filler, a ceramic material, or the like is employed. The insulating layer 5 is bonded to an upper face of the base plate 4 by a resin layer 6.

As the resin layer 6, adhesive resin may be employed. Specifically, silicone resin, epoxy resin, acrylic resin, or the like may be employed. Here, the resin layer 6 may contain filler. When filler is contained, the thermal conductivity of the resin layer 6 is improved. The filler may be any material such as a ceramic material or a metallic material as long as the material has a higher thermal conductivity than the resin material. Specifically, when the filler is to be composed of metal, for example, aluminum may be employed. Further, when the filler is to be composed of a ceramic material, alumina, silicon carbide, aluminum nitride, or silicon nitride may be employed.

The plasma etching apparatus 100 includes: the base plate 4; and a high frequency applying electrode (not shown) provided oppositely in the inside of the chamber. For example, a high frequency such as 13.56 MHz is applied to the high frequency applying electrode provided oppositely so that plasma is generated. The high frequency passes through the resin layer 6, the insulating layer 5, the heat-generating resistor 2, and the substrate 1. Here, in the lower face of the substrate 1, there are a portion where the heat-generating resistor 2 is provided and a portion where the heat-generating resistor 2 is not provided. At that time, in a case where the glass component is present immediately above the heat-generating resistor 2 alone in the substrate 1, a difference in the dielectric permittivity in the vicinity of the lower face of the substrate 1 causes non-uniformity in the plasma density so that a difference is caused in the etching rate on the sample. Then, an effective countermeasure is that the region containing the glass component is extended in the planar direction of the lower face of the substrate 1 and that the glass components resulting from diffusion of glass component from adjacent regions of the plurality of regions provided adjacent to the heat-generating resistor 2 are continuous to each other. This reduces the difference in the dielectric permittivity in the vicinity of the lower face of the substrate 1 so that the plasma density can be made uniform. As a result, variation in the etching rate can be suppressed.

In the plurality of regions provided adjacent to the heat-generating resistor 2, for example, the interval of adjacent regions may be set to be 0.5 to 10 mm. Further, in order to make the plasma density more uniform, it is preferable to set the interval to be 0.5 to 2 mm. The width of the heat-generating resistor 2 may be set to be 0.5 to 10 mm. Further, in order to make the plasma density more uniform, it is preferable to set the width to be 0.5 to 2 mm.

The following description is given for an example of a fabrication method for the sample holder 10 shown in FIG. 1. Here, the description is given for an example that alumina ceramics is employed in the substrate 1. However, a similar fabrication technique may be applied also to other ceramic materials such as an aluminum nitride ceramic.

First, alumina powder having a grain diameter of 0.1 to 2 µm and serving as a main raw material and a minute amount of sintering aid are weighed by predetermined amounts.

Then, wet crushing and mixing is performed together with ion exchange water or an organic solvent and balls fabricated from high-purity alumina in the inside of a ball mill for 24 to 72 hours.

Predetermined amounts of an organic binder such as polyvinyl alcohol, polyvinyl butyral, and acrylic resin and a plasticizer and an antifoaming agent serving as auxiliary organic materials are added to the raw material slurry obtained by crushing and mixing as described above. Then, the raw material slurry is mixed further for 24 to 48 hours. The organic-inorganic slurry mixture obtained by mixing is formed into a ceramic green sheet having a thickness of 20 μm to 20 mm by employing a doctor blade method, a calender roll method, a press molding method, an extrusion molding method, or the like.

Then, a paste-like electrode material such as platinum and tungsten for forming the adsorption electrode 3 is printed onto the ceramic green sheet for forming the substrate 1 by a publicly known screen printing method or the like.

Here, in order to form the adsorption electrode 3 at a predetermined position in the substrate 1, ceramic green sheets on which the paste-like electrode material is not printed and an electrode formation green sheet on which the paste-like electrode material has been printed are stacked on each other. As for the stacking, stacking is performed at a predetermined temperature in a state where a pressure at or above the yield stress value of the ceramic green sheet is applied. As the method of applying the pressure, a publicly known technique such as a uniaxial pressing method and an isostatic pressing method may be employed. The obtained stack is fired at a predetermined temperature in a predetermined atmosphere so that the substrate 1 in which the adsorption electrode 3 is buried can be fabricated.

Then, the substrate 1 is machined into a predetermined shape and thickness by using a machining center, a rotary machining apparatus, or a cylindrical grinder.

Then, the lower face of the substrate 1 is formed into a roughened surface by sandblast and, after that, coated with paste obtained by adding a metallic component such as silver palladium and a glass component composed of the oxide of a material such as silicon, bismuth, calcium, aluminum, and boron. After that, firing is performed at a temperature of approximately 800° C. so that the heat-generating resistor 2 is formed. Further, the heat-generating resistor 2 is trimmed by machining by employing a laser or the like so that the resistance of the heat-generating resistor 2 is adjusted to a desired resistance. As such, the sample holder 10 can be fabricated.

EXAMPLE

Samples of sample Nos. 1 to 5 according to an example of the invention and a comparative example were fabricated. In the present example and the comparative example, alumina ceramics was employed in the substrate 1.

First, alumina powder having a grain diameter of 0.1 to 2 μm and serving as a main raw material and a minute amount of sintering aid were weighed by predetermined amounts. Then, wet crushing and mixing was performed together with ion exchange water, an organic solvent, or an organic dispersant and balls fabricated from high-purity alumina in the inside of a ball mill for 48 hours. Predetermined amounts of an organic binder such as polyvinyl alcohol, polyvinyl butyral, and acrylic resin and a plasticizer and an antifoaming agent serving as auxiliary organic materials were added to the raw material slurry obtained by crushing and mixing as described above. Then, the raw material slurry was mixed further for 3 hours. The organic-inorganic slurry mixture obtained by mixing was formed into a ceramic green sheet of 100 μm by a doctor blade method.

Then, a paste-like electrode material composed of tungsten for forming the adsorption electrode 3 was formed on the ceramic green sheet for forming the substrate 1 by screen printing. Here, in order to form the adsorption electrode 3 at a predetermined position in the substrate 1, ceramic green sheets on which the paste-like electrode material is not printed and an electrode formation green sheet on which the paste-like electrode material has been printed were stacked on each other. Then, pressurization was performed by using a uniaxial press so that a stack was formed. Then, the obtained stack was fired at a temperature of 1570° C. in a reducing atmosphere of hydrogen gas. The substrate 1 was machined into a predetermined shape by using a machining center, a rotary machining apparatus, or a cylindrical grinder. As such, machining was performed such that the thickness from the adsorption electrode 3 to the sample holding surface 11 became 0.3 mm and the entire thickness of the substrate 1 became 2 mm.

TABLE 1

| | Heat-generating resistor 2 | | | | Lower face of substrate 1 Arithmetic mean roughness Ra (μm) | Glass diffusion region 12 | | Durability test result (cycle) |
| --- | --- | --- | --- | --- | --- | --- | --- | --- |
| | Main raw material | Firing temperature (° C.) | Interval (mm) | Width (mm) | | Spread in thickness direction (mm) | Spread in planar direction (mm) | |
| Sample No. 1 | Ag—Pd | 780 | 3 | 3 | 0.05 | 0.1 | 0 | 1500 |
| Sample No. 2 | Ag—Pd | 850 | 3 | 3 | 0.05 | 0.2 | 0.2 | 2200 |
| Sample No. 3 | Ag—Pd | 850 | 3 | 3 | 0.4 | 0.2 | 0.4 | 3000 |
| Sample No. 4 | Ag—Pd | 850 | 3 | 3 | 2.2 | 0.2 | 0.8 | 5000 |
| Sample No. 5 | Ag—Pd | 850 | 1.5 | 1.5 | 2.2 | 0.2 | 0.75 or more | No damage |
| Comparative example | W | 1500 | 3 | 3 | 0.05 | 0 | 0 | 500 |

Then, the heat-generating resistor 2 was formed under the conditions shown in Table 1. Specifically, first, the lower face of the substrate 1 was machined so as to become the arithmetic mean roughness Ra shown in Table 1. After that, the paste constituting the heat-generating resistor 2 was printed such as to satisfy the interval and the width shown in Table 1. Here, in sample Nos. 1 to 5, as the paste constituting the heat-generating resistor 2, a paste containing silver palladium as the main component and containing the oxide of each of silicon, boron, and bismuth as the glass component was employed. Further, in the sample of the comparative example, as the paste constituting the heat-generating resistor 2, a paste containing tungsten as the main component was employed. Then, the heat-generating resistor 2 was fired with the conditions shown in Table 1. By virtue of this firing, the heat-generating resistor 2 was formed and, at the same time, in sample Nos. 1 to 5, the glass component was caused to diffuse into the vicinity region of the heat-generating resistor 2.

Here, adjustment of the arithmetic mean roughness Ra of the lower face of the substrate 1 was performed by the following method. Specifically, in a case where Ra was set to be 0.05 µm like in sample Nos. 1 and 2, a lapping process was performed by employing a lapping machine fabricated from tin and by using a lapping liquid containing diamond having an average grain diameter of 1 µm. In a case where Ra was set to be 0.4 µm like in sample No. 3, a lapping process was performed by employing a lapping machine fabricated from cast iron and by using a lapping liquid containing diamond having an average grain diameter of 15 µm. Further, in a case where Ra was set to be 2.2 µm like in sample Nos. 4 and 5, blast processing was performed by using abrasive grains.

Here, in order to cause the glass component to diffuse from the heat-generating resistor 2 into the substrate 1, the following point is important. Specifically, in the conventional art, at the time of firing of silver palladium, in general, heating was performed at about 700 to 750° C. However, in sample Nos. 1 to 5 according to an example of the invention were heated at 780 to 850° C. By virtue of this, the glass component of the heat-generating resistor 2 can satisfactorily diffuse into the substrate 1.

Further, in order to intensively heat the heat-generating resistor 2 and the vicinity region of the heat-generating resistor 2, the following method was employed. Specifically, a ceramic plate was disposed so as to be opposite to the lower face of the substrate 1 and so as not to be in contact with the heat-generating resistor 2. By virtue of this, the heat radiated from the vicinity of the heat-generating resistor 2 to the outside can be made difficult to escape the outside. Thus, the heat-generating resistor 2 can be heated more efficiently and hence the glass component of the heat-generating resistor 2 can more satisfactorily diffuse into the substrate 1.

The width of the heat-generating resistor 2 was set to be 1.5 mm and the interval of adjacent regions of the plurality of regions provided adjacent to the heat-generating resistor 2 was set to be 3 mm. Then, as shown in Nos. 1 to 4 in Table 1, the samples for the sample holder 10 were fabricated in which the region containing the glass component was changed in a direction perpendicular to the lower face of the substrate 1 and the horizontal direction along the lower face of the substrate 1 by adjusting the arithmetic mean roughness Ra of the lower face of the substrate 1.

Here, in the sample fabricated as the comparative example, tungsten paste was employed and firing was performed at 1500° C. so that the heat-generating resistor was formed.

Then, a durability test was performed on the fabricated samples for the sample holder 10. Here, in a state where the lower face of the sample holder 10 was cooled to 25° C., a voltage of 200 V was applied to the heat-generating resistor 2. Specifically, a process of applying the voltage until the temperature of the sample holder 10 reaches 120° C.; at the time of having reached 120° C., stopping application of the voltage; performing cooling until the sample holder 10 becomes 50° C.; and applying a voltage of 200 V again so that the sample holder 10 is brought into 120° C. was defined as one cycle. Then, a durability test was performed in which the cycle was repeated 10000 times. Then, the number of cycles repeated until damage occurred in the heat-generating resistor was adopted as the durability test result.

As seen from the results shown in Table 1, in the sample of the comparative example, damage in the heat-generating resistor occurred in 500 cycles. In sample Nos. 1 to 5 according to an example of the invention, damage in the heat-generating resistor occurred in 1500 cycles in sample No. 1, in 2200 cycles in sample No. 2, in 3000 cycles in sample No. 3, and in 5000 cycles in sample No. 4. In sample No. 5, damage in the heat-generating resistor did not occur even after 10000 cycles. These results may be interpreted as being obtained by a mechanism that the presence of the glass diffusion region 12 around the heat-generating resistor 2 has improved adhesion between the substrate 1 and the heat-generating resistor 2 so that separation of the heat-generating resistor 2 became difficult to occur.

Further, the substrate 1 after the above-mentioned durability test was cut and then the glass diffusion region 12 was checked by surface analysis of EPMA. As a result, as shown in Table 1, the presence of the glass diffusion region 12 has been found. Here, the "spread in thickness direction" in Table 1 indicates the spread of the glass diffusion region 12 from the lower face of the substrate 1 toward a direction perpendicular to the lower face of the substrate 1. Further, the "spread in planar direction" indicates the spread of the glass diffusion region 12 in the horizontal direction along the lower face of the substrate 1 when viewed from the end part of the portion contacting the heat-generating resistor 2 provided on the lower face of the substrate 1. As seen from the results shown in Table 1, a sample having a larger arithmetic mean roughness Ra has a larger spread in the planar direction of the glass diffusion region 12. Further, it is recognized that a larger spread in the planar direction of the glass diffusion region 12 improves more the durability of the sample holder 10. This may be interpreted as being obtained by a mechanism that the spread of the glass diffusion region 12 in the planar direction has improved the horizontal heat uniformity in the substrate 1.

Further, in sample No. 5, from the result of surface analysis of EPMA, it has been confirmed that the glass diffusion regions 12 containing glass component resulting from diffusion of glass from the heat-generating resistors 2 provided adjacent to each other were continuous to each other. Since the adjacent glass diffusion regions 12 were continuous to each other, it was difficult to obtain the exact size of the spread in the planar direction of each glass diffusion region 12. Thus, in Table 1, the spread in the planar direction of sample No. 5 is described as 0.75 (mm) or more with adopting as a reference the half value 0.75 mm of the interval of the heat-generating resistor 2. In the results of the above-mentioned durability tests, as the reason why the durability of sample No. 5 was remarkably excellent in comparison with sample Nos. 1 to 4, it is considered that the glass diffusion regions 12 were continuous to each other and hence the horizontal heat conduction was improved so that the heat uniformity in the substrate 1 was improved and thereby occurrence of a local thermal stress was reduced.

REFERENCE SIGNS LIST

Substrate: 1
Heat-generating resistor: 2

Adsorption electrode: 3
Base plate: 4
Insulating layer: 5
Resin layer: 6
Sample holder: 10
Sample holding surface: 11
Glass diffusion region: 12
Plasma etching apparatus: 100

The invention claimed is:

1. A sample holder, comprising:
   a substrate composed of ceramics, comprising a sample holding surface provided in one main surface thereof;
   an insulating layer provided below the substrate on an other main surface of the substrate;
   a first heat-generating resistor provided in the insulating layer and on the other main surface of the substrate;
   a first glass component located in the substrate on the other main surface of the substrate and in contact with the first heat-generating resistor;
   a second heat-generating resistor provided in the insulating layer and on the other main surface of the substrate adjacent to the first heat-generating resistor
   a second glass component located in the substrate on the other main surface of the substrate and in contact with the second heat-generating resistor; and
   wherein the first glass component is continuous with the second glass component.

2. The sample holder according to claim 1, wherein when viewed from a portion contacting the first heat-generating resistor provided on the other main surface of the substrate, the first glass component spreads in a horizontal direction along the other main surface of the substrate.

3. The sample holder according to claim 2, wherein when viewed from the portion contacting the first heat-generating resistor provided on the other main surface of the substrate, the first glass component spreads more in the horizontal direction along the other main surface of the substrate than in a direction perpendicular to the other main surface of the substrate.

4. The sample holder according to claim 1, wherein the first heat-generating resistor and the second heat-generating resistor are provided in a peripheral edge part of the other main surface of the substrate.

5. The sample holder according to claim 1, wherein the first heat-generating resistor contains a conductor component located in a region that contacts the first glass component.

6. The sample holder according to claim 5, wherein a ratio of the conductor component to the first glass component located in the region that contacts the first heat-generating resistor in the substrate decreases with increasing distance from the first heat-generating resistor.

7. A plasma etching apparatus, comprising:
   a vacuum chamber;
   a base plate comprising a high frequency applying electrode disposed in the vacuum chamber; and
   the sample holder according to claim 1, the sample holder being mounted on the base plate.

8. The sample holder according to claim 1, wherein the second heat-generating resistor contains a conductor component located in a region that contacts the second glass component.

9. The sample holder according to claim 8, wherein a ratio of the conductor component to the second glass component located in the region that contacts the second heat-generating resistor in the substrate decreases with increasing distance from the second heat-generating resistor.

* * * * *